United States Patent
Le Blevennec et al.

(10) Patent No.: US 11,667,833 B2
(45) Date of Patent: Jun. 6, 2023

(54) SOLUTION FOR USE IN FILLING MICROMETER-SIZE CAVITIES

(71) Applicant: COMMISSARIAT A L'ENERGIE ATOMIQUE ET AUX ENERGIES ALTERNATIVES, Paris (FR)

(72) Inventors: Gilles Le Blevennec, Bernin (FR); Sonia De Sousa Nobre, Saint Martin le Vinoux (FR); Olivier Poncelet, Grenoble (FR)

(73) Assignee: COMMISSARIAT A L'ENEGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 257 days.

(21) Appl. No.: 16/769,034

(22) PCT Filed: Dec. 4, 2018

(86) PCT No.: PCT/FR2018/053094
§ 371 (c)(1),
(2) Date: Jun. 2, 2020

(87) PCT Pub. No.: WO2019/110910
PCT Pub. Date: Jun. 13, 2019

(65) Prior Publication Data
US 2021/0032533 A1  Feb. 4, 2021

(30) Foreign Application Priority Data
Dec. 5, 2017 (FR) ........................ 17 61672

(51) Int. Cl.
*C09K 11/02* (2006.01)
*C08F 120/14* (2006.01)
(Continued)

(52) U.S. Cl.
CPC ............ *C09K 11/02* (2013.01); *C08F 120/14* (2013.01); *C09K 11/08* (2013.01);
(Continued)

(58) Field of Classification Search
CPC ................... C09K 11/02; C09K 11/08; C09K 11/0883–883; C08F 120/14
See application file for complete search history.

(56) References Cited

U.S. PATENT DOCUMENTS

2015/0072092 A1  3/2015  Seo et al.
2017/0306221 A1  10/2017 Koole et al.
2019/0048256 A1  2/2019  Chen et al.

FOREIGN PATENT DOCUMENTS

CN  107474634  * 12/2017
EP  2 826 836 A1  1/2015
(Continued)

OTHER PUBLICATIONS

Translation for CN 107474634, Dec. 15, 2017.*
(Continued)

*Primary Examiner* — C Melissa Koslow
(74) *Attorney, Agent, or Firm* — Oblon, McClelland, Maier & Neustadt, L.L.P.

(57) ABSTRACT

Solution for use in filling micrometer-size cavities (10), the solution comprising a first solvent, a first polymer (102) having a first molecular weight, a second polymer (103) having a second molecular weight, luminophores (101) and a surfactant, the second molecular weight being 10 to 50 times greater than the first molecular weight.

22 Claims, 3 Drawing Sheets

(51) Int. Cl.
| | |
|---|---|
| *C09K 11/08* | (2006.01) |
| *C09K 11/77* | (2006.01) |
| *C09K 11/66* | (2006.01) |
| *C09K 11/88* | (2006.01) |
| *H01L 33/50* | (2010.01) |
| *C09K 11/61* | (2006.01) |
| *C09K 11/56* | (2006.01) |
| *C09K 11/62* | (2006.01) |
| *B82Y 20/00* | (2011.01) |
| *B82Y 30/00* | (2011.01) |
| *B82Y 40/00* | (2011.01) |

(52) U.S. Cl.
CPC ........ *C09K 11/0883* (2013.01); *C09K 11/565* (2013.01); *C09K 11/567* (2013.01); *C09K 11/617* (2013.01); *C09K 11/621* (2013.01); *C09K 11/661* (2013.01); *C09K 11/7774* (2013.01); *C09K 11/77346* (2021.01); *C09K 11/77347* (2021.01); *C09K 11/77348* (2021.01); *C09K 11/883* (2013.01); *H01L 33/50* (2013.01); *H01L 33/507* (2013.01); *B82Y 20/00* (2013.01); *B82Y 30/00* (2013.01); *B82Y 40/00* (2013.01)

(56) References Cited

FOREIGN PATENT DOCUMENTS

| | | | |
|---|---|---|---|
| WO | WO 2013/088907 | * | 6/2013 |
| WO | WO 2013088907 | * | 6/2013 |
| WO | WO 2017/180333 | * | 10/2017 |
| WO | WO 2017/180333 A1 | | 10/2017 |

OTHER PUBLICATIONS

Translation for WO 2013/088907, Jun. 20, 2013.*
International Search Report dated Apr. 2, 2019 in PCT/FR2018/053094 filed on Dec. 4, 2018, citing documents AA-AC, AO and AP therein, 2 pages
French Preliminary Search Report dated Jul. 13, 2018 in French Application 1761672 filed on Dec. 5, 2017.

* cited by examiner

SOLUTION FOR USE IN FILLING MICROMETER-SIZE CAVITIES

TECHNICAL FIELD AND PRIOR ART

The present invention relates to a solution for use in filling micrometer-sized cavities.

The present invention also concerns a method for producing a composite material, comprising a polymer matrix in which luminophores are dispersed, in micrometer-size cavities, from such a solution.

The invention is applicable in the field of lighting, for example in car headlights in automobiles, or for the home, or again in the field of image display in general, for example for virtual glasses or low-energy screens.

The development of lighting or display devices is continuously moving towards increased luminous fluxes and towards higher definition of emissive surfaces. For example, in the case of lighting, movement has taken place from the incandescent bulb to lighting using light-emitting diodes (LEDs). For displays, movement has taken place from cathode-ray tubes to liquid-crystal screens, then to organic light-emitting diode screens (OLEDs).

The common response to these two parallel developments is the use of a pixelated array of micrometer-size LEDs (typically having dimensions of order one micrometer to several tens of micrometers).

The LEDs are conventionally produced from gallium nitride (GaN), which emits at wavelengths of order 450 nanometres. However, blue light is the most energetic in the visible spectrum and it is therefore necessary to carry out a conversion operation on the pixel scale in order to obtain white light or in order to obtain a particular wavelength corresponding, for example, to green or red. In order to obtain white light, it is possible to combine GaN with a photoluminescent element emitting in the yellow range, a complementary colour to blue. The two radiations combine to give a light which then appears as white to the human eye. In general, this involves YAG:Ce, (an acronym which designates "Yttrium Aluminium Garnet" doped with cerium).

In order to produce the conversion device, a solution containing particles of YAG:Ce, in the form of submicron-size particles, and a polymer is deposited in the micrometer-sized cavities (typically less than or equal to 10 µm) situated above the GaN pixels. After evaporation of the solvent, a conversion layer comprising a polymer matrix, in which particles of YAG:Ce are dispersed, is obtained.

However, filling a cavity having a side of at most 10 µm with the solution is a technically difficult problem.

Specifically, the decrease in size of systems is accompanied by a change in the hierarchy of forces: for mobile systems, on the macroscopic scale, gravitational forces and inertial forces dominate, whereas, on the microscopic scale, these are surpassed by capillary forces and surface forces.

Figure 1:
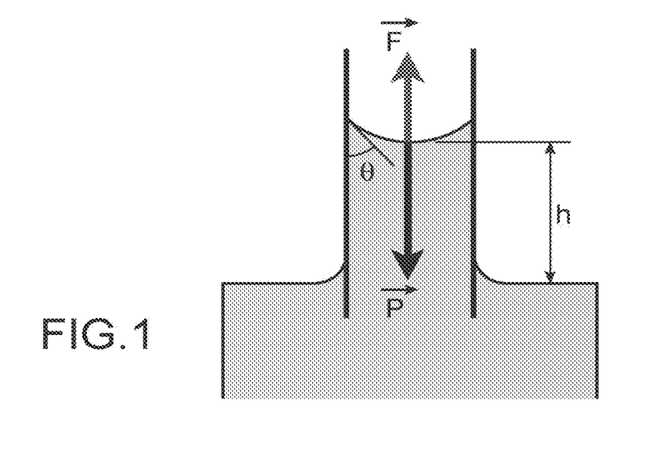
FIG. 1, previously described, is a schematic representation of various forces exerted on a liquid in a tube, FIG. 2, previously described, is a scanning electron microscope image of microcavities filled with a solution according to the prior art.

The capillary effect is an interaction phenomenon that can arise at the interfaces between a liquid and the surface. The capillary effect is due to surface tension forces between the different phases present. Due to the capillary forces on the walls of the cavities, the free surface of the liquid is not horizontal. With reference to FIG. 1, the surface tension force F and the liquid height h are respectively defined by the following equations in the case where the cavity is a tube:

$$F=2\pi r\gamma \cos\theta \text{ and } h=2\gamma \cos\theta/rpg$$

where:

h is the height of the liquid in the tube in m;

γ is the surface tension of the liquid in N·m$^{-1}$;

θ is the contact angle between the liquid and the wall of the tube;

p is the density of the liquid in g·cm$^{-3}$;

r is the radius of the tube in mm;

g is the acceleration due to gravity, which is a constant having a value of approximately 9.81 m·s$^{-2}$.

In general, liquid interfaces in contact with solid lyophilic walls forming a dihedron, have a projection which tends to propagate in the angle in the form of a filament. This effect is due to the fact that the curvature of the interface is very strongly reduced in the angle and due to the fact that the Laplace pressure is low there, which causes a movement of the liquid which advances in the angle. A filament forms when the wetting angle in the angle is smaller than the limit known as the Concus-Finn limit. In the case of wall wetting, the criteria indicating the formation of a liquid filament in a solid angle is expressed by: θ<π/2−α.

Here θ is the Young contact angle (the two walls have the same nature), and α is the half-angle of the dihedron.

Wetting walls give rise to a concave liquid surface, whereas non-wetting walls produce a convex surface. In the case of a non-wetting wall, there is a limit beyond which the liquid detaches completely from the angle. The condition is defined by θ>π/2+α.

The cavities of LEDs are presently made with metallic walls, for example from copper or aluminium. The angles therefore have a greater or lesser degree of sharpness, being right angles, acute or obtuse angles, and the walls are wetting to a greater or lesser degree. It is important that the liquid cannot climb above the wall separating two cavities.

Moreover, the filling of the cavity with a solution containing a solvent and a polymer also poses drying problems. Indeed, as it evaporates, the solvent will deform the air/solid interface, which can create porosity in the material. This phenomenon will depend mainly on the vapour pressure of solvent in proximity with the cavities, which determines the rate of evaporation of the solvent and therefore also determines the ability of the polymer to self-organise or to self-densify in the cavity.

Figure 2:
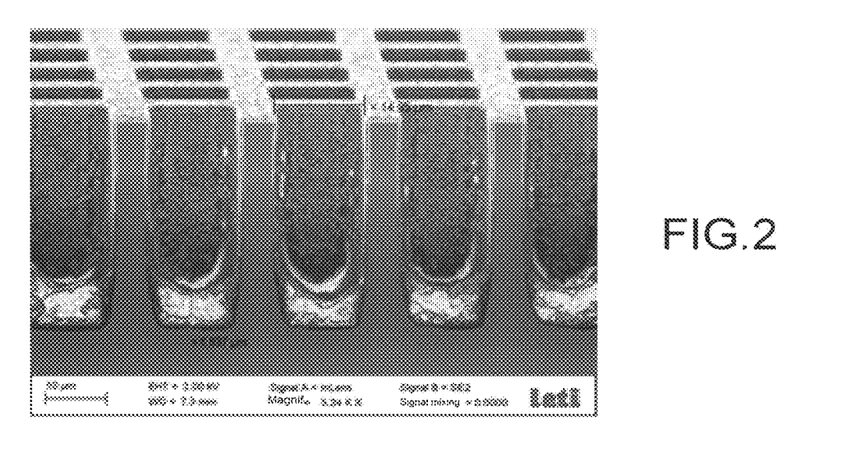

By way of example, FIG. 2 shows microcavities in which a solution containing YAG:Ce and poly(methyl methacrylate) (PMMA) has been deposited. Due to the capillary phenomena, the deposition is mainly located on the walls and cannot perform the desired conversion function.

DISCLOSURE OF THE INVENTION

It is therefore an aim of the present invention to provide a luminophore solution that is able to fill micrometer-size cavities (dimensions less than 100 µm, and preferably less than 20 µm) while avoiding the problems of capillary action and able to leave behind a well-structured solid material, in the cavities, after evaporation of the solvent.

The above stated aim is attained by a solution for use in filling micrometer-size cavities, the solution comprising a first solvent, a first polymer having a first molecular weight, a second polymer having a second molecular weight, luminophores and a surfactant, the second molecular weight being 10 to 50 times greater than the first molecular weight.

The invention differs fundamentally from the prior art through the presence of two polymers, one of low molecular weight relative to the second molecular weight, and therefore having short chain molecules, and the other of high molecular weight relative to the first molecular weight, and therefore having long chain molecules. The presence of large chains structures the solid material at the time of depositing and drying. The luminophores and the first polymer are homogeneously entrained during the filling of the cavities. There is no reduction in the filling level. The presence of large chains prevents the small chains and the luminophores from flowing back under the effect of capillary phenomena. The air/solid interface meniscus, in the cavity, is almost horizontal. During the evaporation of the solvent, there is no collapse of the final solid structure. After evaporation of the solvent, the cavities are homogeneously filled by a composite material comprising a polymer matrix in which the luminophores are homogeneously dispersed. The quality of the composite materials obtained in this way, makes it possible to perform the light conversion function.

Advantageously, the second molecular weight is approximately 20 times greater than the first molecular weight.

Advantageously, the first polymer and the second polymer are chosen independently of each other among a poly(meth) acrylate, a polysiloxane, a polycarbonate, a poly(ε-caprolactone), a polystyrene and one of the copolymers thereof. These polymers are not very reactive with the luminophores. Moreover, they have a good stability over time and/or a good heat resistance.

Advantageously, the first polymer and/or the second polymer are homopolymers.

Advantageously, the first polymer and the second polymer are of the same chemical nature. With polymers of the same nature, the freezing of the polymers and the drying will be more homogeneous. The polymers will have the same chemical affinity, or similar chemical affinities, for the solvent or solvents of the formulation, as well as for the luminophores.

Advantageously, the first polymer and the second polymer are poly(methyl methacrylate). This polymer does not affect the photophysical properties (absorption/emission) of the luminophores and enables then to disperse well in solution, which improves the conversion properties of the composite material filling the cavity.

Advantageously, the solution comprises a second solvent, the boiling point of which is at least 30° C. higher than the temperature of the first solvent. This makes it possible to remove the solvents one after the other. Preferably, a second solvent is chosen having a good affinity for the polymers and a first solvent having a less good affinity for the polymers (so-called intermediate solvent). The good solvent will evaporate first after the deposition. The intermediate solvent will fix and preserve the structure of the polymers, before being evaporated itself.

Advantageously, when the first polymer and the second polymer are PMMA, the first solvent is butanone and the second solvent is anisole.

Advantageously, the luminophores are chosen among the phosphors, such as $SrSi_2O_2N_2:Eu^{2+}$, $\beta$-$SiAlON:Eu^{2+}$, $Y_3Al_5O_{12}:Ce^{3+}$, $SrSi_5N_8:Eu^{2+}$, $(Ba,Sr)_2Si_5N_8:Eu^{2+}$, $(Ca,Sr)AlSiN_3:Eu^{2+}$, $Sr[LiAlN_4]:Eu^{2+}$, $Sr[Mg_3SiN_4]:Eu^{2+}$, $K_2SiF_6:Mn^{4+}$, and among the quantum dots such as ZnS, ZnSe, CdS, CdSe, CdZnSe, CdTe, PbS, InP, $CuInS_2$, $CuGaS_2$, $CuInSe_2$, $CuGaSe_2$, $CuInGaSe_2$, CuSe, InSe, and GaSe. These luminophores have conversion properties that are more stable over time than organic luminophores.

Advantageously, the luminophores have a largest dimension less than 1 μm, and preferably less than 500 nm.

Advantageously the ratio solvent/dry matter is in the range from 40% to 60% by mass. Here, dry mass means the polymers, luminophores and the surfactant. Such a range makes it possible to obtain a solution that is not too viscous, able to be deposited by many liquid deposition techniques and having sufficient material in the cavity. With such mass ratios, the solution is sufficiently wetting in terms of the luminophores to prevent aggregation, the luminophores are well separated and the light conversion is more effective.

Advantageously, the ratio luminophores/dry matter is in the range from 15% to 50% by mass. There are thus sufficient luminophores in the final composite material to perform the light conversion, while limiting the quantity of reagents used.

The invention also concerns a method for preparing a composite material, comprising a polymer matrix in which luminophores are dispersed in micrometer-size cavities, the method comprising the following consecutive steps:
providing a substrate comprising micrometer-size cavities,
depositing a solution as defined above in the cavities, the cavities comprising a bottom, a side wall and an open upper section,
evaporating the solvent or solvents, so as to form a composite material comprising a polymer matrix in which the luminophores 101 are dispersed.

Advantageously, the bottom of the cavities is made of GaN.

Advantageously, the cavities have an open upper section having a largest dimension in the range from 1 μm to 100 μm, and preferably in the range from 1 to 20 μm, and a depth in the range from 1 to 50 μm and preferably from 5 to 10 μm.

Advantageously, the substrate comprises an emission structure having an active zone suitable for emitting a first visible radiation at a first wavelength, the luminophores of the solution deposited in the cavities being suitable for emitting a second visible radiation at a second wavelength by conversion of the first visible radiation, the second wavelength being greater than the first wavelength.

BRIEF DESCRIPTION OF THE FIGURES

The present invention will be better understood on the basis of the following description and the attached drawings, of which.

The various possibilities (variants and embodiments) should be understood as not being exclusive from each other and being able to be combined together.

DETAILED DISCLOSURE OF THE SPECIAL EMBODIMENTS

The solution according to the invention is intended to fill micrometer-size cavities 10. The solution comprises:
- luminophores 101,
- a surfactant,
- a first polymer 102 having a first molecular weight, of low molecular weight,
- the second polymer 103 having a second molecular weight, of high molecular weight,
- one or more solvents.

Figure 3:
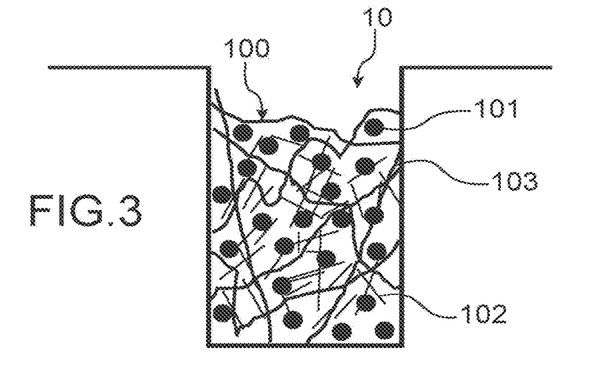
FIG. 3 is a schematic representation, in cross-section, of a microcavity filled with the solution according to a particular embodiment of the invention.

As shown in FIG. 3, after evaporation of the solvent or solvents, the cavities 10 are partially or completely filled by a composite material 100 comprising a polymer matrix 102, 103 in which the luminophores 101 are homogeneously dispersed.

The luminophores 101:

The luminophores 101 are in the form of particles. Here, particles means elements of micrometer or nanometre size and having a spherical, cylindrical or ovoid shape.

In general, the luminophores 101 have a largest dimension less than 1 μm, and preferably less than 500 nm.

The luminophores 101 can be organic fluorophores and/or phosphors and/or quantum dots.

According to a first advantageous embodiment, the luminophores 101 can be chosen among the phosphors, inorganic luminescent materials, preferably in the form of particles. The green to yellow phosphors are $SrSi_2O_2N_2$:$Eu^{2+}$, $\beta$-SiAlON:$Eu^{2+}$, $Y_3Al_5O_{12}$:$Ce^{3+}$, YAG:Ce; the orange and red phosphors can be $SrSi_5N_8$:$Eu^{2+}$, or again nitrides such as $(Ba,Sr)_2Si_5N_8$:$Eu^{2+}$, $(Ca,Sr)AlSiN_3$:$Eu^{2+}$, $Sr[LiAlN_4]$:$Eu^{2+}$, $Sr[Mg_3SiN_4]$:$Eu^{2+}$, or a sulfide, or again a fluoride such as $K_2SiF_6$:$Mn^{4+}$. A mixture of these phosphors can be chosen to fill the cavities 10. The phosphors have a largest dimension in the range from 10 nm to 300 nm, for example of order 100 nm.

According to a second advantageous embodiment, the luminophores 101 can be quantum dots. The quantum dots are semiconductor nanocrystals. They can emit in the ultraviolet, visible, near infrared and infrared. Certain quantum dots advantageously emit at a very narrow wavelength (typically, the width at half-height of the emission peak is 30 nm). The quantum dots have a largest dimension in the range from 2 nm to 20 nm, and preferably from 1 nm to 10 nm. The quantum dots can be chosen among ZnS, ZnSe, CdS, CdSe, CdZnSe, CdTe, PbS, InP, $CuInS_2$, $CuGaS_2$, $CuInSe_2$, $CuGaSe_2$, $CuInGaSe_2$, CuSe, InSe, and GaSe. A mixture of these quantum dots can be chosen to fill the cavities 10. Since their absorption is high and their emission is strong, it is possible to use them in low quantities, in contrast to organic fluorophores which have a very low luminous intensity.

Preferably, the filling rate of luminophores 101 in the dry matter after deposition is in the range from 15% to 50% by volume.

The Surfactant:

The surfactant ensures the dispersion of the luminophores 101 in the solution. The surfactant can partially or completely cover the surface of the luminophore particles 101. A surfactant is chosen which does not modify the optical properties of the luminophores.

The surfactant is preferably non-ionic, in other words it is preferably not charged. It can be, for example, one of the TEGO®-type surfactants marketed by Evonik Resource Efficiency GmbH. A Siloxane-based TEGO® for example is chosen, in order to have a device with a high longevity. It is also possible to choose a surfactant from the Triton™ range marketed by the Dow Chemical Company.

The Polymers 102, 103:

The solution comprises a first polymer 102 having a first molecular weight and a second polymer 103 having a second molecular weight, the second molecular weight being 10 to 50 times greater than the first molecular weight, and preferably 15 to 35 times greater than the first molecular weight.

Here, molecular weight means the number average molecular weight Mn, also called the number average molar mass, and corresponds to the average of molar masses weighted by the number of chains of each length. The molecular weight can, for example, be determined by size-exclusion chromatography with polystyrene standards.

For example, the polymers originate from a radical polymerisation reaction where the polydispersity index I is Mw/Mn=2.

In general, the first molecular weight is at least 500 g/mol and at most 50,000 g/mol, and preferably from 10,000 g/mol to 25,000 g/mol.

In general, the second molecular weight is at least 5000 g/mol and at most 2,500,000 g/mol, and preferably at least 50,000 g/mol and at most 1,250,000 g/mol.

The first polymer 102 and the second polymer 103, having different molecular weights, and therefore different chain lengths, serve as a matrix to mechanically hold the luminophores 101.

The high molecular weight polymer 103 will play the role of a texturing agent by freezing and preserving the extended or "swollen" structure of the polymers. The low molecular weight polymer will shrink in order to adhere on the skeleton of the high molecular weight polymer. The luminophore particles remain trapped in the polymer network and do not migrate. This makes it possible to reduce or eliminate the shrinkage during drying.

At the time of filling of the cavity with the solution, the large chains act as a skeleton for the polymer structure. These large chains will freeze the luminophore load and the small polymer chains, which leads to a good homogeneity of the solution and therefore to a good distribution of the luminophores within the microcavity. This structuring of the polymers has a positive impact on the control of the shrinkage of the solvent: the framework formed by the large chains will limit and control the shrinkage effects associated with the evaporation of the solvent.

With such a solution, there is no deformation of the air/solid interface during the evaporation of the solvent.

In order to have an "instantaneous" freezing during drying, a second molecular weight is chosen that is from 10 to 50 times greater than the first molecular weight. For example, a second molecular weight is chosen which is 20 times greater than the first molecular weight.

In order to choose the polymers 102, 103, a person skilled in the art will take into account, in particular, the stability of the solution and its viscosity in order to be able to deposit it by means of currently available deposition techniques.

The ratio between long chains and short chains makes it possible to control the initial viscosity of the mixture and to formulate a solution with a viscosity that is compatible with, for example, a coating process. The first low molecular weight polymer 102 is preferably in the majority, in other words the first polymer 102 represents more than 50% of the total mass of polymers. The solutions obtained can be deposited by many deposition techniques and are stable over time, which allows them to be deposited in a manner reproducible over time.

Polymers will also be chosen which have a refractive index that does not disrupt the excitation of the luminophores for the extraction of the emitted light.

The choice of polymers will therefore also take into account the capacity of the solvent(s)/polymers/surfactant system to disperse the luminophores.

The polymers 102, 103 are preferably chosen, independently of one another, among polyalkylmethacrylates (such as PMMA), polyarylmethacrylates, polycyclic polymethacrylates (for example of polybornanemethacrylate type), polyalkyl acrylates, polyarylacrylates, polyarylsiloxanes and polyalkylsiloxanes. The polymers can also be chosen among polycarbonates, poly(ε-caprolactone), and polystyrenes. The polymers are preferably non-substituted polymers. These polymers fulfil the criteria set out above. These polymers have, for example, a C1-C10 carbon chain.

The polymers 102, 103 can be homopolymers or copolymers of the previously cited polymers.

It is possible to use polymers 102, 103 of different chemical nature, for example PMMA and polystyrene.

It is also possible to use polymers 102, 103 of the same chemical nature, in other words of the same family. Preferably, the two polymers 102, 103 are two PMMA of different molecular weights.

The Solvent(s):

The solvent is preferably organic.

In order to have a low viscosity, a solution is advantageously chosen which contains at least one good solvent. This solution may additionally comprise an intermediate solvent.

Here, good solvent means that it allows the polymer chains to be swollen. Polymer/polymer interactions are disadvantaged. The polymers are well dispersed in the solvent.

Here, intermediate solvent means that it is indifferent to having polymer/polymer or polymer/solvent interactions.

Here, poor solvent means that the polymer/polymer interactions are favoured, the polymer chains collapse on themselves and/or precipitate entirely.

The choice of solvent can be made using the Hansen parameters. The Hansen parameters make it possible to determine a sphere of solubility for each type of polymer. Each solvent also has its own Hansen parameters. It is therefore possible to locate the solvent in the same reference frame as the sphere of the polymer studied. If the solvent is in the sphere, it is a good solvent for the polymer. If the solvent is outside the sphere, then it is a poor solvent of the polymer. These parameters also make it possible to calculate the coordinates of a mixture of solvents.

By way of illustration, the Hansen parameters of PMMA are [17.7, 9.1, 7.1], those of anisole (also called methoxybenzene) are [17.8, 4.1, 6.7], and those of methyl ethyl ketone (also called butanone or MEK) are [16, 9, 5.1]. The first two are paramount for the choice of the solvent. MEK is a good solvent of PMMA, and anisole is an intermediate solvent.

In order to limit the interactions between the polymer chains in solution, and therefore to retain a reasonable viscosity, it is also necessary that the difference between the boiling points of the solvents is at least thirty degrees Celsius and that it is preferably the best solvent which is the most volatile.

For PMMA, a solution can therefore be chosen containing a good solvent such as MEK (boiling point: 89° C.) and an intermediate solvent such as anisole (boiling point: 155.5° C.). MEK, the good solvent, will evaporate first after the deposition. Anisole, being an intermediate solvent, will fix and preserve the structure of the polymers.

It is also possible to determine the polymers/solvents associations by using the Hildebrand solubility parameter.

The solubility parameter for PMMA, methyl ethyl ketone and anisole are respectively: 9.3 $(cal/cm^3)^{1/2}$, 9.43 $(cal/cm^3)^{1/2}$ and 9.7 $(cal/cm^3)^{1/2}$. This confirms the results obtained using the Hansen parameter: MEK is a better solvent for PMMA than anisole.

The viscosity will be determined depending on the wet deposition technique (coating, ink jet, spin coating, for example).

A solution is chosen which is sufficiently wetting to disperse the luminophores but not too wetting as not to create convex menisci in the microcavities.

The ratio solvent/dry matter is preferably in the range from 40% to 60% by mass.

Method for Filling the Cavities 10 with Luminophores 101:

The method for filling the micrometer-size cavities 10 with luminophores 101 comprises the following consecutive steps:

providing a substrate comprising micrometer-size cavities 10, depositing a solution as defined above in the cavities 10, evaporating the solvent or solvents so as to obtain a dry composite material comprising a polymer matrix in which the luminophores 101 are dispersed.

Figure 4:
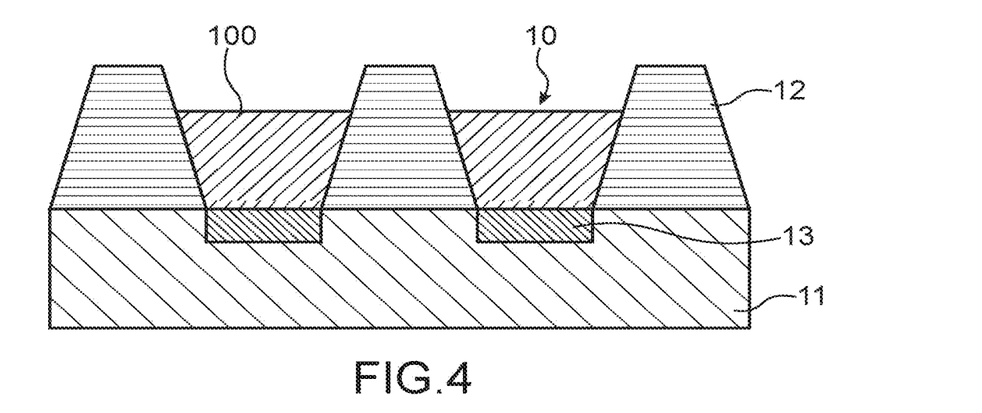
FIG. 4 is a schematic representation, in cross-section, of a substrate comprising a plurality of microcavities filled with a solution according to a particular embodiment of the invention.
Figure 5:
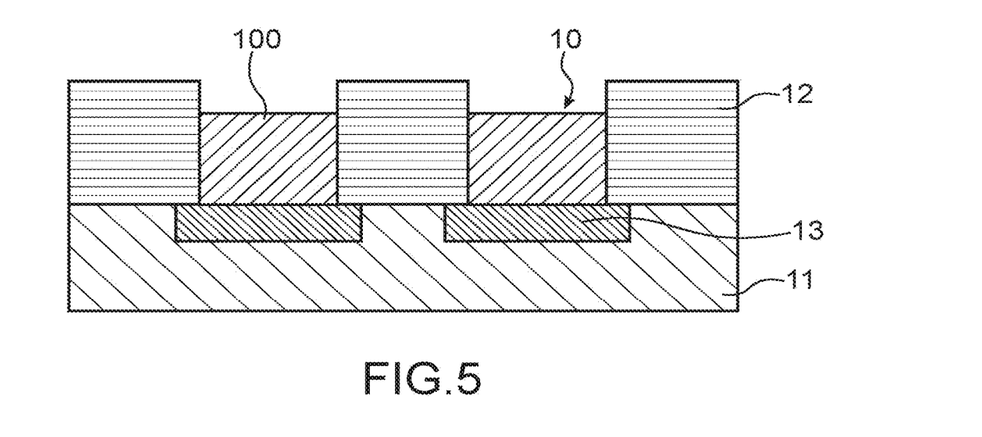
FIG. 5 is a schematic representation, in cross-section, of a substrate comprising a plurality of microcavities filled with a solution according to a particular embodiment of the invention.

As shown in FIGS. 4 and 5, the substrate comprises at least one cavity 10 to be filled. Preferably, the substrate comprises a plurality of cavities 10. The cavities 10 are, for example, arranged forming an array with a plurality of rows and a plurality of columns of cavities. The spacing of the cavities in the plane of the substrate is, for example, between approximately 10 μm and 100 μm, and preferably between 50 μm and 100 μm.

The cavities 10 are of micrometer size, in other words they have dimensions ranging from the order of one micrometer to hundreds of micrometers. These are also referred to as microcavities.

The cavities 10 have a closed lower wall 13 (or bottom), a side wall 12 and an open upper section. The lower wall and the upper section can have identical or different shapes, for example circular, elliptical, square, rectangular shape, etc. The cavities are, for example, tubes of square or circular cross-section.

The height of the side wall 12 defines the depth of the cavity 10. The cavities 10 have a depth ranging from several micrometers (for example, 1, 2 or 3 μm) to 50 μm, preferably from 5 μm to 10 μm.

The cavities 10 have an upper section having a largest dimension ranging from a few micrometers (for example, 1, 2 or 3 μm) to 100 μm, and preferably from 1 μm to 20 μm, for example in the order of 10 μm.

The walls 12 of the cavities 10 can be formed of any suitable material.

This may be a metallic wall 12, such as copper or aluminium, or a metal oxide wall, for example made of alumina (FIG. 4). Such a wall 12 can be produced by electrochemical deposition, optionally following by an oxidation step. Advantageously, the wall 12 is reflective and non-absorbent.

The walls 12 can be produced from a temporary material (FIG. 5), in other words after obtaining the composite material 100, in the cavities 10, the wall 12 is removed. It may be a resin, for example. The resin can be removed by chemical means. An array of pads of composite material 100, separated by air, is thus obtained.

The bottom 13 of the cavity 10 is a light-emitting layer lt may be, for example, a layer of GaN.

The cavities 10 can be produced on a support 11 made, for example, of CdSe or InGaN, or made of an InGaN/GaN bilayer.

Preferably, the substrate comprises an emission structure having an active zone suitable for emitting a first visible radiation at a first wavelength $\lambda_1$, the luminophores 101 of the solution deposited in the cavities 10 being suitable for emitting a second visible radiation at a second wavelength $\lambda_2$ by conversion of the first visible radiation, the second wavelength $\lambda_2$ being such that $\lambda_1 < \lambda_2$.

The solution can be deposited by any liquid dispensing technique. By way of illustration, this may be a deposition by inkjet, spraying, soaking, coating (with a doctor blade or by spin coating deposition), or 3D printing.

For conversion layers comprising quantum dots, it is possible to have a composite material 100 having a thickness ranging, for example, from 5 to 10 μm. The quantum dots have a good absorption. A low quantity is sufficient.

For conversion layers comprising phosphors, it is possible to have a composite material 100 having a thickness ranging, for example, from 50 μm to 100 μm.

ILLUSTRATIVE EXAMPLES AND NON-LIMITING EMBODIMENTS

The following table describes various solutions. The solutions S19, S20, S25 and S26 are solutions according to the invention and comprising two PMMA of different molecular weights. The solutions S17, S18, S23 and S24 had been produced by way of comparison and contain only one PMMA. The surfactant is TEGO® Dispers 670, marketed by Evonik Resource Efficiency GmbH.

Figure 6:
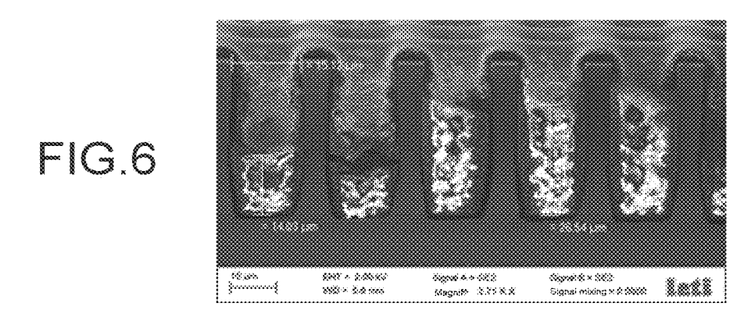
FIG. 6 is a scanning electron microscope image, by secondary electrons, of microcavities filled with a solution having a single polymer.
Figure 7:
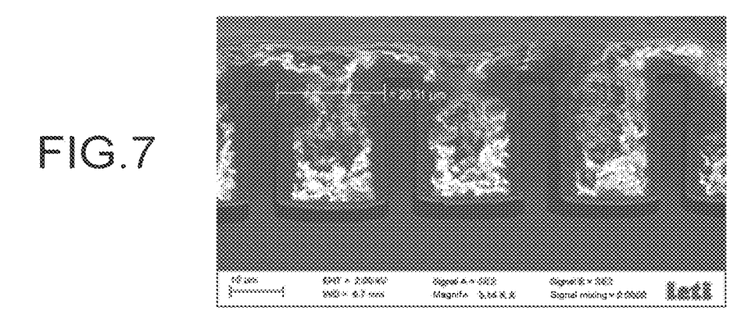
FIG. 7 is a scanning electron microscope image, by secondary electrons, of microcavities filled with a solution having two polymers, according to a particular embodiment of the invention.
Figure 8:
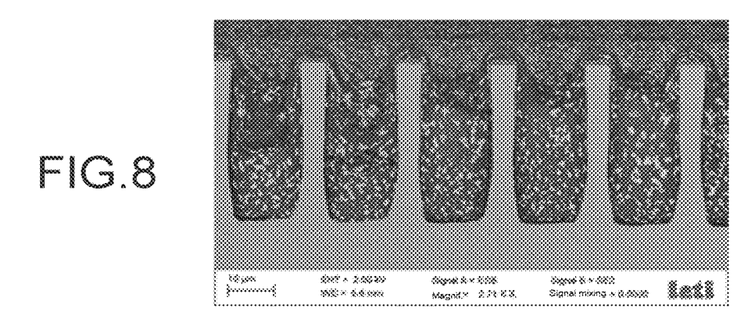
FIG. 8 is a scanning electron microscope image, by backscattered electrons, of microcavities filled with a solution having a single polymer.

The cavities filled with the solutions according to the invention (FIGS. 7 and 9) have a homogeneous distribution of luminophores over the entire height of the cavity. This is not the case for the comparative solutions (FIGS. 6 and 8).

The invention claimed is:

1. A solution, comprising a first solvent, a first polymer having a first molecular weight, a second polymer having a second molecular weight, luminophores and a surfactant, the second molecular weight being 10 to 50 times greater than the first molecular weight,
   wherein the first polymer and the second polymer are chosen, independently of one another, from the group consisting of polyalkylmethacrylates, polyarylmethacrylates, polycyclic polymethacrylates, polyalkyl acrylates, polyarylacrylates, polyarylsiloxanes and polyalkylsiloxanes.

2. The solution according to claim 1, wherein the second molecular weight is approximately 20 times greater than the first molecular weight.

3. The solution according to claim 1, wherein the first polymer and/or the second polymer are homopolymers.

4. The solution according to claim 1, wherein the first polymer and the second polymer are of the same chemical nature.

5. The solution according to claim 1, wherein the first polymer and the second polymer are poly(methyl methacrylate).

6. The solution according to claim 1, wherein the solution comprises a second solvent, the boiling point of which is at least 30° C. higher than the temperature of the first solvent.

7. The solution according to claim 6, wherein the first solvent is butanone and the second solvent is anisole.

8. The solution according to claim 6, wherein the first polymer and the second polymer are poly(methyl methacrylate), the first solvent is butanone and the second solvent is anisole.

9. The solution according to claim 1, wherein the luminophores are selected from the group consisting of phosphors and quantum dots.

10. The solution according to claim 9, wherein
   the phosphors are selected from the group consisting of $SrSi_2O_2N_2:Eu^{2+}$, #### β-$SiAlON:Eu^{2+}$, $Y_3Al_5O_{12}:Ce^{3+}$, $SrSi_3N_8:Eu^{2+}$, $(Ba,Sr)_2Si_5N_8:Eu^{2+}$, $(Ca,Sr)AlSiN_3:Eu^{2+}$, $Sr[LiAlN_4]:Eu^{2+}$, $Sr[Mg_3SiN_4]:Eu^{2+}$, $K_2SiF_6:Mn^{4+}$, and

|  | S17 | S19 | S18 | S20 | S23 | S25 | S24 | S26 |
|---|---|---|---|---|---|---|---|---|
| PMMA | 8.4% 15,000 g/mol | 8.4% 5.9% of 15,000 g/mol 2.5% of 350,000 g/mol | 15.2% 15,000 g/mol | 15.2% 13.7% of 15,000 g/mol 1.5% of 350,000 g/mol | 8.4% 15,000 g/mol | 5.9% of 15,000 g/mol 2.5% of 350,000 g/mol | 17.5% 15,000 g/mol | 15.6% of 15,000 g/mol 1.4% of 350,000 g/mol |
| Anisole |  | 59% |  | 45.7% |  | 62% |  | 52.9% |
| YAG:Ce |  | 3.5% |  | 26.8% |  | 3.6% |  | 3.6% |
| MEK |  | 23.3% |  | 6% |  | 24.3% |  | 24.3% |
| Surfactant |  | 5.8% |  | 6.3% |  | 1.7% |  | 1.7% |

Figure 9:
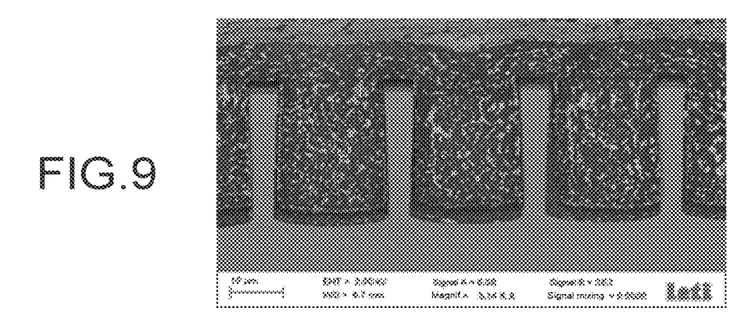
FIG. 9 is a scanning electron microscope image, by backscattered electrons, of microcavities filled with a solution having two polymers, according to a particular embodiment of the invention, The various parts shown in the figures are not necessarily on a uniform scale, in order to make the figures more readable.

These solutions are then deposited on substrates having microcavities, by means of a coating technique. The walls of the cavities are covered by a layer of aluminium. The cavities filled with the solutions have been observed by scanning electron microscopy in secondary electron mode (FIGS. 6 and 7) and in backscattered electron mode (FIGS. 8 and 9).

the quantum dots are selected from the group consisting of ZnS, ZnSe, CdS, CdSe, CdZnSe, CdTe, PbS, InP, $CuInS_2$, $CuGaS_2$, $CuInSe_2$, $CuGaSe_2$, $CuInGaSe_2$, CuSe, InSe, and GaSe.

11. The solution according to claim 1, the luminophores have a largest dimension less than 1 μm.

12. The solution according to claim 1, wherein the ratio solvent/dry matter is in the range from 40% to 60% by mass.

13. The solution according to claim 1, wherein the ratio luminophores/dry matter is in the range from 15% to 50% by mass.

14. The solution according to claim 1, wherein the luminophores have a largest dimension less than 500 nm.

15. A method for preparing a composite material, comprising a polymer matrix in which luminophores are dispersed, in micrometer-size cavities, the method comprising the following consecutive steps:

providing a substrate comprising micrometer-size cavities, the cavities comprising a bottom, a side wall and an open upper section;

depositing a solution according to claim 1, in the cavities; and evaporating the solvent or solvents, so as to form a composite material comprising a polymer matrix in which the luminophores are dispersed.

16. The method according to claim 15, wherein the bottom of the cavity comprises GaN.

17. The method according to claim 15, wherein the cavities have an open upper section having a largest dimension in the range from 1 μm to 100 μm, and a depth in the range from 1 to 50 μm.

18. The method according to claim 17, wherein the cavities have an open upper section having a largest dimension in the range from 1 to 20 μm, and a depth in the range from 5 to 10 μm.

19. The method according to claim 15, wherein the substrate comprises an emission structure, the emission structure corresponding to the bottom of the cavities, the emission structure having an active zone suitable for emitting a first visible radiation at a first wavelength, the luminophores of the solution deposited in the cavities being suitable for emitting a second visible radiation at a second wavelength by conversion of the first visible radiation, the second wavelength being greater than the first wavelength.

20. A solution, comprising a first solvent, a first polymer having a first molecular weight, a second polymer having a second molecular weight, luminophores and a surfactant, the second molecular weight being 10 to 50 times greater than the first molecular weight, wherein the first polymer and/or the second polymer are homopolymers.

21. A solution, comprising a first solvent, a first polymer having a first molecular weight, a second polymer having a second molecular weight, luminophores and a surfactant, the second molecular weight being 10 to 50 times greater than the first molecular weight, wherein the ratio solvent/dry matter is in the range from 40% h to 60% by mass.

22. A solution, comprising a first solvent, a first polymer having a first molecular weight, a second polymer having a second molecular weight, luminophores and a surfactant, the second molecular weight being 10 to 50 times greater than the first molecular weight, wherein the ratio luminophores/dry matter is in the range from 15% to 50% by mass.

* * * * *